United States Patent [19]

Carpenter

[11] Patent Number: 5,541,448
[45] Date of Patent: Jul. 30, 1996

[54] ELECTRONIC CIRCUIT CARD

[75] Inventor: Alton D. Carpenter, Houston, Tex.

[73] Assignee: Texas Instruments Inc., Dallas, Tex.

[21] Appl. No.: 778,418

[22] Filed: Oct. 16, 1991

[51] Int. Cl.$^6$ .......................... H01L 23/02; H01L 23/04; G06K 5/00; H05K 1/14
[52] U.S. Cl. .......................... 257/679; 257/681; 257/699; 235/380; 361/737
[58] Field of Search .................. 219/121.69; 307/150; 361/385, 393, 398, 737; 257/679, 681, 699; 235/380

[56] References Cited

U.S. PATENT DOCUMENTS

| | | | |
|---|---|---|---|
| 3,372,310 | 3/1968 | Kantor | 317/101 |
| 4,386,388 | 5/1983 | Beun | 361/399 |
| 4,602,164 | 7/1986 | Gore, III et al. | 361/393 |
| 4,668,314 | 5/1987 | Endoh et al. | 219/121.69 |
| 4,749,875 | 7/1988 | Hara | 307/150 |
| 4,789,347 | 12/1988 | Banjo et al. | 439/140 |
| 4,798,946 | 1/1989 | Fujii et al. | 235/492 |
| 4,811,165 | 3/1989 | Currier et al. | 361/386 |
| 4,838,804 | 6/1989 | Banjo et al. | 439/325 |
| 4,854,883 | 8/1989 | Tuckwood | 439/84 |
| 4,864,116 | 9/1989 | Banjo et al. | 235/492 |
| 4,872,091 | 10/1989 | Maniwa et al. | 361/424 |
| 4,884,169 | 11/1989 | Cutchaw | 361/385 |
| 4,889,498 | 12/1989 | Mizuta | 439/86 |
| 4,941,835 | 7/1990 | Lasmayou et al. | 439/152 |
| 4,975,805 | 12/1990 | Schmutzler | 361/399 |
| 5,136,470 | 8/1992 | Sheridon et al. | 361/398 |
| 5,208,732 | 5/1993 | Baudovin et al. | 361/386 |

*Primary Examiner*—David C. Nelms
*Assistant Examiner*—Trong Phan
*Attorney, Agent, or Firm*—Wade James Brady III; Rose Alyssa Keagy; William W. Holloway

[57] ABSTRACT

An electronic circuit card has a metal case including top and bottom surfaces connected by first and second sidewalls and a rear wall. The case has an interior chamber and an opening at one end. A substrate is positioned in the interior chamber and a connector attached to the substrate and case so as to cover the opening. A metal spring is attached to the substrate in contact with a ground conductor on the substrate. The spring contacts the top and bottom surfaces of the case to support the substrate and to couple the case to the ground conductor. The case provides protection from electrostatic discharge and radio frequency interference and is capable of receiving substrates having different sizes or shapes or different arrangements of mounted electronic components.

17 Claims, 4 Drawing Sheets

ELECTRONIC CIRCUIT CARD

CROSS-REFERENCE TO RELATED APPLICATIONS

The following coassigned patent applications are hereby incorporated herein by reference:

| Serial No. | Filing Date | TI Case No. |
|---|---|---|
| 07/515,807 | 04/30/90 | 15197 |
| 07/707,353 | 03/29/91 | 16188 |

FIELD OF THE INVENTION

This invention generally relates to the field of packaging plural electronic devices in a common container. More particularly, this invention relates to integrated circuit cards containing plural semiconductor memory and related devices, such as DRAMs, SRAMs, ROMs, EPROMs, EERPOMs, and PROMs or other nonvolatile memory, in a container about the size of a credit card that is readily handled by a user and easily plugged into desired equipment.

BACKGROUND OF THE INVENTION

The use of functional electronic circuits packaged in the "Credit Card" format is becoming widespread. The phrase "Credit Card" used to describe this format of packaging is derived from the fact that the packages are about the size of a credit card, except that the thickness is approximately 3.4 millimeters.

These cards find utility in numerous electronic systems. In personal computers they supplement or replace floppy disks by carrying software programs and data and are connected to the internal logic through a port on the side of the computer cabinet. Portable personal computers, notebook computers, and pocket diaries particularly find these cards convenient because they avoid the need for the expense, power requirements, bulk, and weight of a disk drive; the card needs only an electrical connector and minimal structural support.

Facsimile and copy machines use such cards to store data related to usage control. Typewriters and printers use such cards to store desired memory fonts. Word processors use such cards to store text. Hand-held terminals use card to store inventory control information. Electronic cash registers use cards to store price information. Controllable machinery can use cards to store automation control information. Programmable controllers can use cards to store process control data. Electronic game systems can use cards to store the specifics of games to be enacted on TV screens by the players.

Other areas that can benefit from the use of electronic circuit cards include bulk data acquisition such as in music and photography, where the desired song or picture is stored in memory devices of the card.

Presently available electronic circuit cards typically include one or more plastic-encapsulated or other types of integrated circuits solder attached to connection stripes or spots on a printed wire board. A connector is solder attached to metal lines which are formed on the printed wire board and extend to one edge of the board. The connector connects external power, signal, and ground lines to circuitry in the card. An external shell or encasement surrounds the printed wire board/connector assembly to physically protect and provide rigidity to the assembly, and to provide an aesthetically pleasing appearance. The encasement typically has top and bottom frames formed from molded plastic and bonded together along an outer edge to define an interior chamber in which the printed wire board is located. The top and bottom frames have ribs which contact and securely hold the printed wire board and connector in place. Top and bottom metal plates are bonded to the top and bottom frames, respectively, and cover openings in the top and bottom frames.

The use of a plastic frame adds significantly to the complexity, tooling costs, and tooling turn around time in electronic circuit card construction. This is due to the fact that the manufacture of a plastic frame requires the use of a mold. Whenever the size of the printed wire board or the number, location, or size of the semiconductor devices on the printed wire board is changed, a new plastic frame that will accommodate the changes is required. The fabrication of the mold for the new frame is extremely time consuming and expensive. As a result, the time and expense incurred in producing electronic circuit cards incorporating even minor design changes are significant.

The use of a molded plastic frame is also a major source of problems during assembly of the electronic circuit card. This results from the fact that molded plastic frames are easily bent and often have surface irregularities introduced during the molding process which prevent all card parts from fitting together properly.

Accordingly, a need exists for an electronic circuit card that can be produced quickly, is simple, inexpensive, and reliable, and overcomes the difficulties associated with molded plastic frames.

SUMMARY OF THE INVENTION

Generally, and in one form of the invention, an electronic circuit card has a case including top and bottom surfaces connected by first and second sidewalls and a rear wall. The case has an interior chamber and an opening at one end. A substrate is positioned in the interior chamber and a connector is attached to the substrate and case to cover the opening.

In another form of the invention, an electronic system includes an electronic apparatus having a fixed connector for receiving a matching connector. The fixed connector is connected to conductors contained within the electronic apparatus. The electronic system also includes an electronic circuit card having a matching connector that connects with the fixed connector. The electronic circuit card includes a case including top and bottom surfaces connected by first and second sidewalls and a rear wall. The case has an interior chamber and an opening at one end. The electronic circuit card also includes a substrate positioned in the interior chamber with the matching connector attached to the substrate and case and covering the opening.

Advantages of the invention include a reduction in the number of parts and manufacturing steps required to make an electronic card and a case which can accept substrates having different sizes and shapes or different configurations of mounted electronic components.

BRIEF DESCRIPTION OF THE DRAWINGS

Corresponding numerals and symbols in the different figures refer to corresponding parts unless otherwise indicated.

DETAILED DESCRIPTION OF PREFERRED EMBODIMENTS

Figure 1:
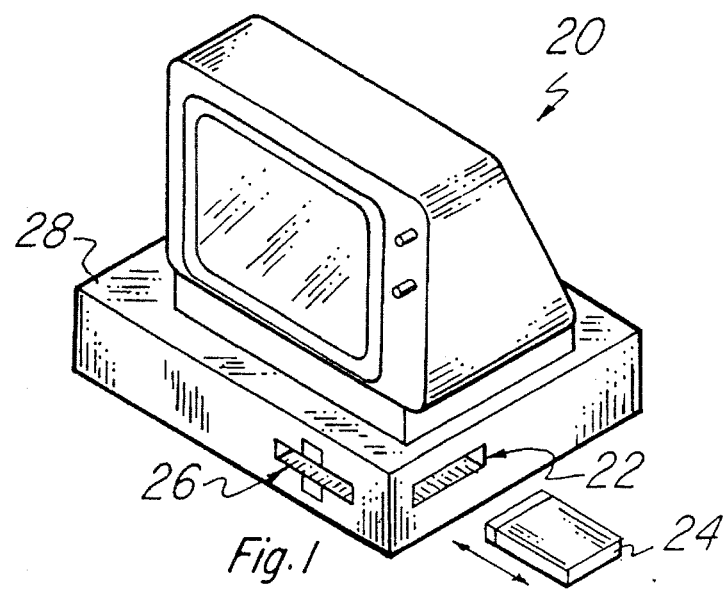
FIG. 1 is a perspective view of a personal computer using the electronic circuit card of the invention.

In FIG. 1, personal computer 20 includes a port 22 for receiving an electronic circuit card 24 of the invention. Port 22 connects memory card 24 to conductors, such as address and data lines, contained within personal computer 20. Electronic circuit card 24 can be used for any one of several purposes, including augmenting the semiconductor memory of the personal computer, presenting software or data to the personal computer through the port 22 or reconfiguring the personal computer 20 through information stored in the solid state or semiconductor memory devices carried in electronic circuit card 24. Electronic circuit card 24 can be used in addition to or in place of floppy disk port 26, also located on the cabinet 28 of the personal computer.

Figure 2:
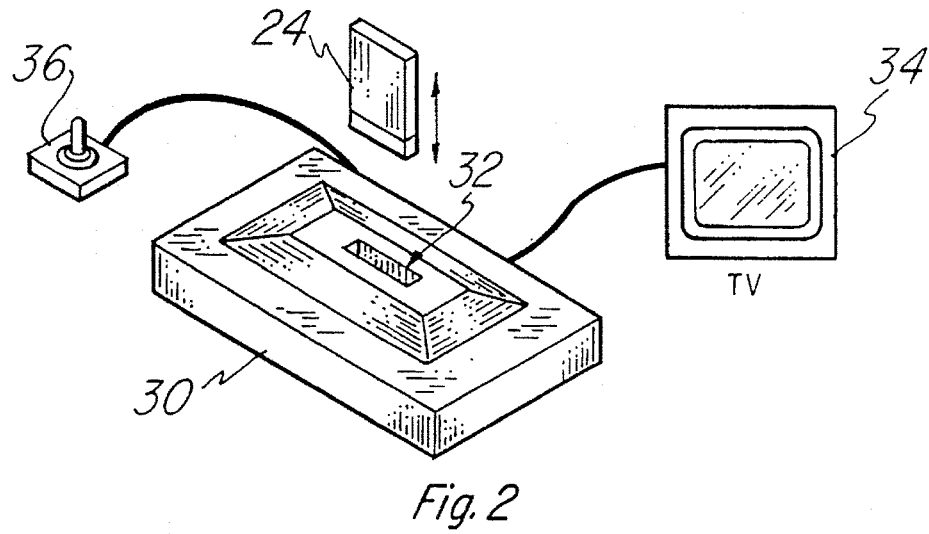
FIG. 2 is a perspective view of a game controller using the electronic circuit card of the invention.

In FIG. 2, a game controller 30 receives the electronic circuit card 24 through a port 32. Port 32 connects memory card 24 to conductors, such as address and data lines, contained within game controller 30. In this instance, the electronic circuit card 24 carries software and data for the controller to execute a game displayed on TV 34 in response to the user effecting actions on the joystick 36.

Figure 3:
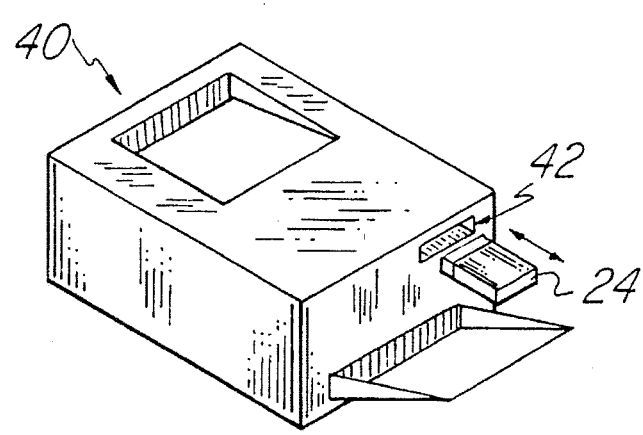
FIG. 3 is a perspective view of a laser printer using the electronic circuit card of the invention.
Figure 5:
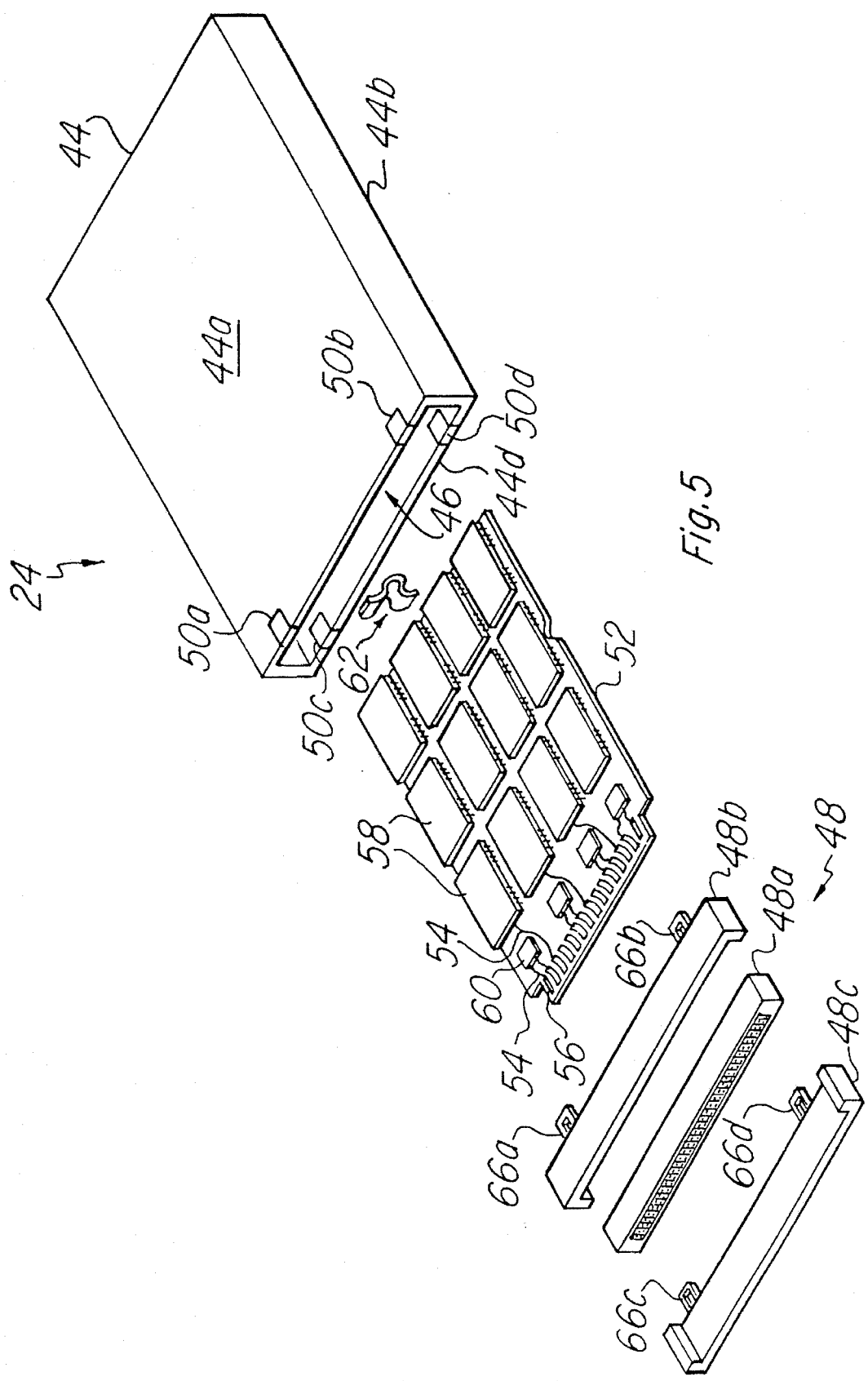
FIG. 5 is an exploded perspective view of an electronic circuit card of FIG. 4.
Figure 4:
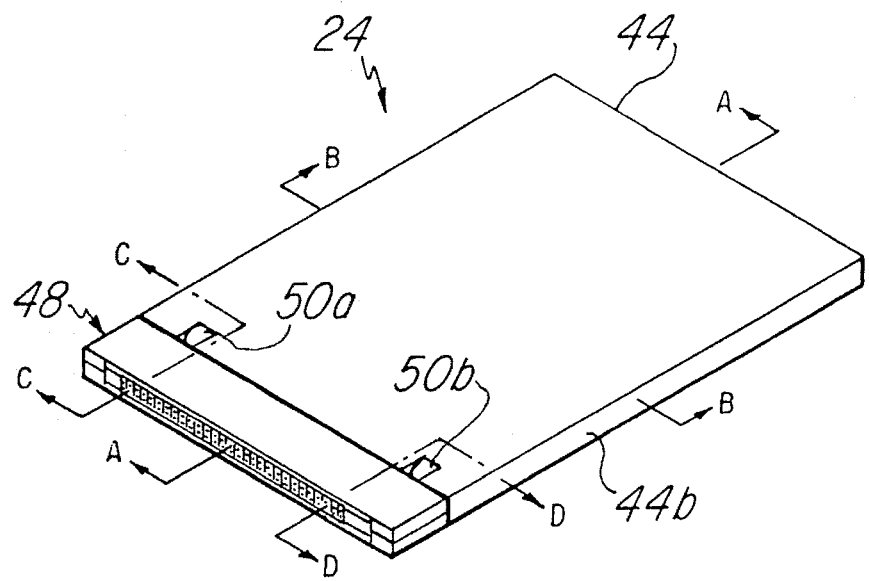
FIG. 4 is a perspective view of an electronic circuit card according to the invention.
Figure 6:
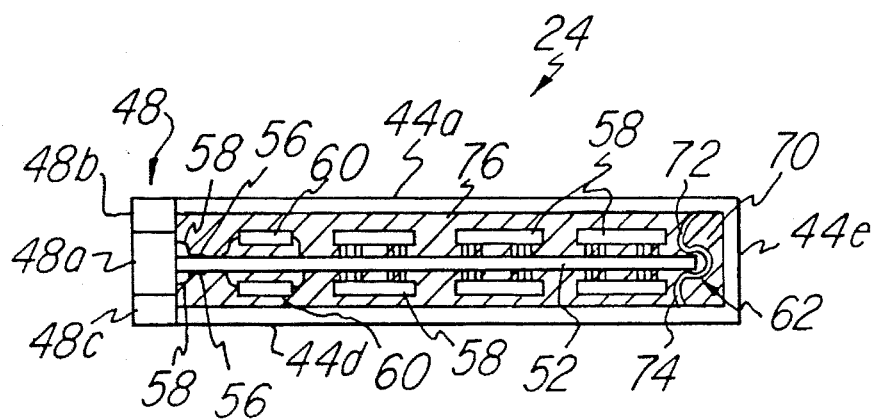
FIG. 6 is a cross-section of FIG. 4 taken along section lines a—a of FIG. 4.
Figure 7:
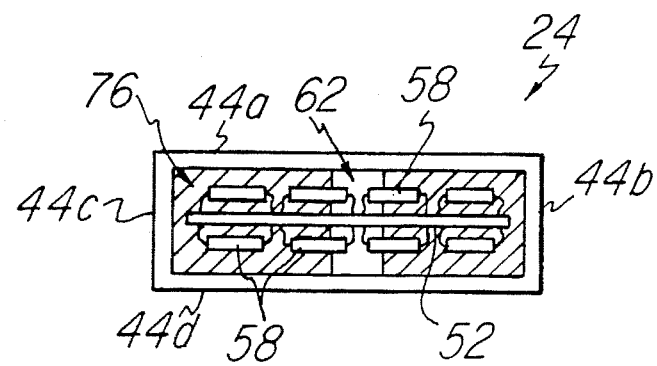
FIG. 7 is a cross-section of FIG. 4 taken along section lines b—b of FIG. 4.
Figure 8B:
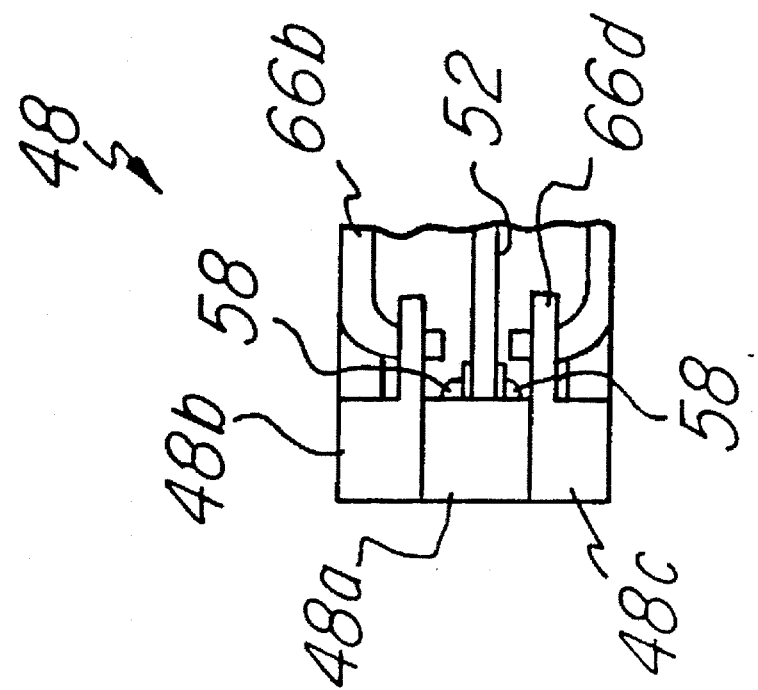
FIG. 8b is a partial cross-section of FIG. 4 taken along section lines d—d of FIG. 4.
Figure 8A:
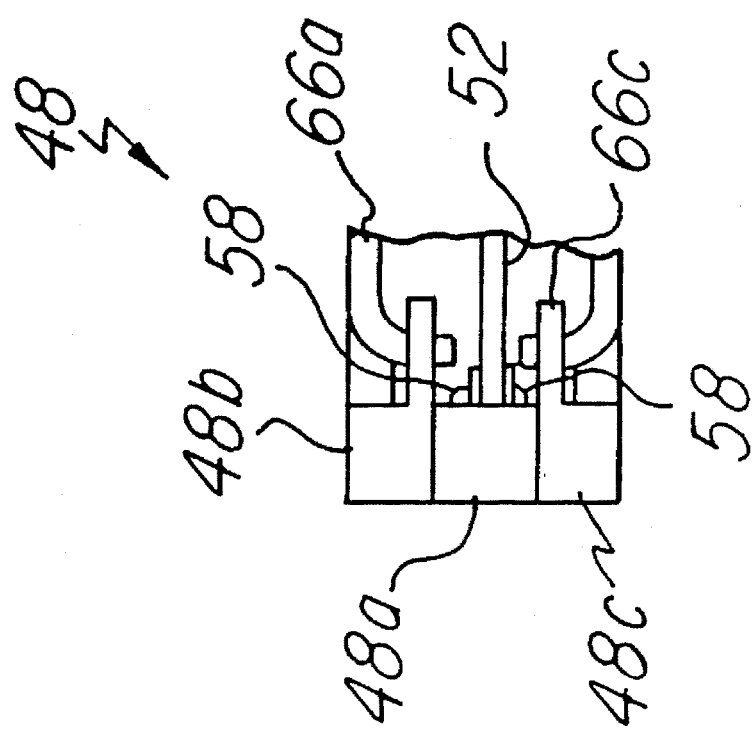
FIG. 8a is a partial cross-section of FIG. 4 taken along section lines c—c of FIG. 4.

In FIG. 3, laser printer 40 receives electronic circuit card 24 at port 42 for controlling the type fonts or other desired features of the laser printer. Port 42 connects memory card 24 to conductors, such as address and data lines, contained within laser printer 40.

As seen in FIG. 4–8b, electronic circuit card 24 includes a single piece case 44 which is closed on five of six sides to define an interior chamber 46. A connector 48 is attached to case 44 and covers an opening to interior chamber 46 in one side of case 44. Case 44 is formed from a metal, such as aluminum or stainless steel, for example, to shield internal circuitry from radio frequency interference. Case 44 has planar top and bottom surfaces 44a and 44d, sidewalls 44b and 44c, and rear wall 44e. Sidewalls 44b and 44c and rear wall 44e are substantially perpendicular to and connect top and bottom surfaces 44a and 44d. Sidewalls 44b and 44c are substantially perpendicular to rear wall 44e.

Case 44 may be formed from a single piece of metal by deep drawing or reverse impact extrusion. Alternatively, one or more sheets of metal may be welded together to form case 44. Tabs 50a and 50b are formed in surface 44a adjacent the opening to interior chamber 46 in case 44 by cutting pairs of slits through surface 44a. Tabs 50c and 50d are formed in surface 44d of case 44 adjacent the opening to interior chamber 46 by cutting pairs of slits through surface 44d.

Card 24 includes a substrate or printed wire board 52 located in interior chamber 46 and having top and bottom surfaces on which printed circuit leads 54 are formed. Metal lines 56 are formed on substrate 52 adjacent an edge of substrate 52 for connection to solder tails 58 of connector 48. Metal lines 56 electrically contact selected printed circuit leads 54. Plural semiconductor devices 58 are solder attached to connection spots on the top and bottom surfaces of substrate 52 and are electrically connected to selected printed circuit leads 54 to implement a desired function. Devices 58 may be memory devices, such as DRAMs, SRAMs, ROMs, PROMs, or other forms of memory, to implement a memory function.

Other semiconductor devices, such as devices 60, may also be mounted on substrate 52 to perform driving, decoding, or other selected memory functions. Although not shown, discrete components, such as transistors, resistors, and capacitors, could be mounted on substrate 52 in addition to or in place of packaged integrated circuits 58 and 60 and interconnected to perform a desired electronic function.

Connector 48 includes a center portion 48a, which may be a standard commercially available connector from Molex or DuPont, for example, to which top and bottom portions 48b and 48c are adhesively bonded. Top and bottom portions 48b and 48c are shaped such that connector 48 covers the opening to interior chamber 46 when attached to case 44. Center portion 48a has solder tails 58 which are solder attached to metal lines 56. Top connector portion 48b includes upper retainers 66a and 66b, which lie adjacent upper surface 44a when substrate 52 is inserted into case 44. Bottom connector portion 48c includes lower retainers 66c and 66d, which lie adjacent lower surface 44b when substrate 52 is inserted into case 44. Retainers 66a–d have openings for receiving tabs 50a–d, respectively. After the substrate 52 is inserted into case 44, tabs 50a–d are bent so as to extend through the openings in retainers 66a–d and thereby securely attach connector 48 to case 44.

As an alternative to using separate top and bottom connector portions 48b and 48c, a single piece connector portion surrounding center portion 48 shaped to cover the opening to interior chamber 46 could be used.

A formed metal spring 62 has a curved gripping portion 70 which, when forced over an edge of substrate 52 securely holds spring 62 to substrate 52. Gripping portion 70 contacts a printed circuit lead 54 on substrate 52 which is coupled to the host system ground via connector 48 and does not contact any printed circuit leads which serve as power or signal lines. Spring 62 has legs 72 and 74 which contact top and bottom planar surfaces 44a and 44d of case 44. Spring 62 couples case 44 to system ground to provide a path for draining static electricity from a human body to system ground. Legs 72 and 74 of spring 62 are sufficiently rigid to support the end of substrate 52 adjacent rear wall 44e at a position substantially level with the end of substrate 52 which is attached to connector 48. This reduces stress on substrate 52 at the junction with connector 48.

The interior chamber of case 44 may be filled with a liquid hardenable filler 76, such as an elastomeric polymer, prior to complete insertion of substrate 52 into case 44. Filler 76 encapsulates substrate 52 to protect substrate 52 and devices 58 and 60 and provide further structural rigidity for card 24. Filler 76 also acts as a thermal coupler to couple heat generated by devices 58 and 60 to metal case 44. Metal case 44 acts as a heat spreader providing rapid dissipation of heat to prevent malfunction of devices 58 and 60 due to overheating.

Since substrate 52 is supported in interior chamber 46 by connector 48, spring 62, and filler 76, case 44 can accommodate substrates of different sizes and shapes as long as the substrate will fit in interior chamber 46. In addition, since case 44 does not contact electronic components, such as devices 58 and 60, mounted on substrate 52, the particular components or arrangement of such components may be changed without requiring modifications to case 44.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic circuit card, comprising:

an integral case including top and bottom walls connected by first and second sidewalls and a rear wall, said integral case presenting an interior chamber opening to one end of said integral case;

a substrate positioned in said interior chamber through said opening; and a connector attached to said substrate and said integral case abutting said integral case at said opening to close said opening of said integral case.

2. The electronic circuit card of claim 1, further comprising electronic components mounted on said substrate.

3. The electronic circuit card of claim 2, in which said electronic components include packaged semiconductor devices.

4. The electronic circuit card of claim 2, in which said substrate includes top and bottom surfaces, said electronic components being mounted on said top and bottom surfaces.

5. The electronic circuit card of claim 1, further comprising a support having a gripping portion and first and second legs extending from said gripping portion, said gripping portion attached to said substrate, said first leg contacting said top surface and said second leg contacting said bottom surface to support said substrate between said top and bottom surfaces.

6. The electronic circuit card of claim 5, in which said case is conductive, said support is conductive, and said support contacts a ground conductor on said substrate.

7. The electronic circuit card of claim 6, in which said support is a metal spring.

8. The electronic circuit card of claim 5, in which said connector is attached to a front edge of said substrate adjacent said opening and said support is attached to a rear edge of said substrate adjacent said rear wall.

9. The electronic circuit card of claim 1, in which said case is metal.

10. The electronic circuit card of claim 1, further comprising a filler in said interior chamber, said filler contacting said substrate and said top and bottom surfaces to support said substrate between said top and bottom surfaces.

11. The electronic circuit card of claim 10, in which said filler comprises a liquid hardenable material.

12. The electronic circuit card of claim 11, in which said liquid hardenable material is an elastomeric polymer.

13. The electronic circuit card of claim 1, in which said case includes tabs which are bent into openings in said connector to secure said connector to said case.

14. The electronic circuit card of claim 1, in which said top surface of said case includes first and second tabs, said bottom surface of said case includes third and fourth tabs, said connector includes a rear surface and first, second, third, and fourth retainers, said rear surface adjacent said interior chamber, said first and second retainers extending from said rear surface and located adjacent said top surface of said case, said third and fourth retainers extending from said rear surface and located adjacent said bottom surface of said case, said first, second, third, and fourth tabs extending into openings in said first, second, third, and fourth retainers, respectively, to secure said connector to said case.

15. An electronic system, comprising:

an electronic apparatus having a fixed connector for receiving a matching connector, said fixed connector connected to conductors contained within said electronic apparatus; and an electronic circuit card having a matching connector that connects with said fixed connector, said electronic circuit card including an integral case including top and bottom walls connected by first and second sidewalls and a rear wall, said integral case presenting an interior chamber opening to one end of said integral case, a substrate positioned in said interior chamber through said opening, said matching connector attached to said substrate and abutting said integral case at said opening to close said opening of said integral case.

16. An electronic circuit card, comprising:

an integral case including a top wall with a top side and a bottom wall with a bottom side connected by
   a. a first side wall with a first side,
   b. a second side wall with a second side and
   c. a rear wall,
   said case presenting an interior chamber and an opening at one end of said integral case;

a substrate positioned in said interior chamber through said opening having a top side, a bottom side, a first side, a second side, a third side, and a fourth side;

a center connector portion having a top side, a bottom side, a first side, a second side, a third side, and a fourth side, said third side of said center connector portion attached to said first side of said substrate;

a top connector portion having a top side, a front side, a rear side, a first side and a second side, said top connector portion covering said top side and upper half of said second and fourth sides of said center connector portion, said top side of said top connector portion being coplanar with said top side of said top wall of said integral case, said first side of said top connector portion being coplanar with said first side of said first side wall, said second side of said top connector portion being coplanar with said second side of said second side wall, and said top connector portion having two retainers extending from said rear side of said top connector portion for receiving tabs bent from said top wall of said integral case;

a bottom connector portion having a bottom side, a front side, a rear side, a first side and a second side, said bottom connector portion covering said bottom side and bottom half of said second and fourth sides of said center connector portion, said bottom side of said bottom connector portion being coplanar with said bottom side of said bottom wall of said integral case, said first side of said bottom connector portion being coplanar with said first side of said first side wall, said second side of said bottom connector portion being coplanar with said second side of said second side wall, said front side of said bottom connector portion being coplanar with said first side of said center connector portion and said front side of said top connector portion, and said bottom connector portion having two retainers extending from said rear side of said bottom connector portion for receiving tabs bent from said bottom wall of said integral case; and said center connector portion, said top connector portion and said bottom connector portion abuts said integral case at said opening to close said opening of said integral case.

17. The electronic circuit card of claim 16 further comprising a support having a gripping portion and first and second legs extending from said gripping portion, said gripping portion attached to said third side of said substrate, said first leg contacting said top wall and said second leg contacting said bottom wall to support said substrate between said top and bottom walls.

* * * * *